United States Patent [19]

Murakami et al.

[11] Patent Number: 5,161,167
[45] Date of Patent: Nov. 3, 1992

[54] SEMICONDUCTOR LASER PRODUCING VISIBLE LIGHT

[75] Inventors: Takashi Murakami; Shigeki Kageyama; Kazuo Mizuguchi, all of Itami, Japan

[73] Assignee: Mitsubishi Denki Kabushiki Kaisha, Tokyo, Japan

[21] Appl. No.: 717,046

[22] Filed: Jun. 18, 1991

[30] Foreign Application Priority Data

Jun. 21, 1990 [JP] Japan ................................. 2-163650
Oct. 12, 1990 [JP] Japan ................................. 2-274700

[51] Int. Cl.$^5$ .............................................. H01S 3/19
[52] U.S. Cl. ........................................ 372/46; 372/45
[58] Field of Search ............................ 372/45, 46, 44

[56] References Cited

U.S. PATENT DOCUMENTS

| | | | |
|---|---|---|---|
| 4,470,976 | 4/1988 | Kajimura et al. | 372/45 |
| 5,048,037 | 9/1991 | Arimoto et al. | 372/45 |
| 5,105,432 | 4/1992 | Murakami et al. | 372/46 |

FOREIGN PATENT DOCUMENTS

| | | |
|---|---|---|
| 0325272 | 7/1989 | European Pat. Off. . |
| 0328393 | 8/1989 | European Pat. Off. . |
| 0334637 | 9/1989 | European Pat. Off. . |
| 3410793 | 10/1984 | Fed. Rep. of Germany . |
| 2568064 | 1/1986 | France . |
| 55-095387 | 7/1980 | Japan . |
| 63-314882 | 12/1988 | Japan . |
| 63-314883 | 12/1988 | Japan . |
| 1-90584 | 4/1989 | Japan . |
| 1-134985 | 5/1989 | Japan . |
| 2139422 | 11/1984 | United Kingdom . |
| 2163288 | 2/1986 | United Kingdom . |

OTHER PUBLICATIONS

Kawata et al, "Room-Temperature ... Semiconductor Laser ... Active Layer", Electronics Letters, vol. 24, No. 24, 1988, pp. 1489–1489.
Tanaka et al, "Transverse-Mode ... Semiconductor Lasers ... Etch-Stop Layer", Applied Physics Letters, vol. 54, No. 15, 1989 pp. 1391–1393.
Nitta et al, "Astigmatism in Ridge-Stripe InGaAlP Laser Diodes", Japanese Journal of Applied Physics, vol. 28, No. 11, 1989, L2089–L2091.
Abstract 28-ZG-4 from the Spring 1989 Applied Physics Meeting sponsored by the Japanese Society of Applied Physics.
Ishikawa et al, "InGaAlP Transverse Mode Stabilized Visible Laser Diodes Fabricated By MOCVD Selective Growth", Extended Abstracts of the 18th Conference on Solid State Devices and Materials, Tokyo 1986, pp. 153–156.
Fujii et al, "High-Power Operation ... Semiconductor Laser", Electronics Letters, vol. 23, No. 18, 1987, pp. 938–939.

*Primary Examiner*—James W. Davie
*Attorney, Agent, or Firm*—Leydig, Voit & Mayer

[57] ABSTRACT

A semiconductor laser producing visible light includes a first conductivity type GaAs substrate, a first conductivity type $(Al_wGa_{1-w})_{0.5}In_{0.5}P$ cladding layer disposed on the substrate, a $(Al_zGa_{1-z})_{0.5}In_{0.5}P$ active layer disposed on the first conductivity type cladding layer wherein $0 \leq z < w$, a second conductivity type $(Al_wGa_{1-w})_{0.5}In_{0.5}P$ cladding layer having a lattice constant and disposed on the active layer, a first conductivity type $In_{1-x}Ga_xAs_{1-y}P_y$ current blocking layer disposed on part of the second conductivity type cladding layer wherein y is approximately equal to $-2x+2$, $0.5 \leq x < 1$, and $0 < y \leq 1$ so that the lattice constant of the current blocking layer is substantially the same as the lattice constant of the second conductivity type cladding layer, a current concentration and collection structure in contact with the second conductivity type cladding layer for concentrating current flow in a central part of the active layer, and first and second electrodes disposed in contact with the substrate and current concentration and collection structure, respectively.

15 Claims, 10 Drawing Sheets

SEMICONDUCTOR LASER PRODUCING VISIBLE LIGHT

FIELD OF THE INVENTION

The present invention relates to a semiconductor laser producing light visible to the naked eye and to a semiconductor laser-employing aluminum gallium indium phosphide (AlGaInP) and indium gallium phosphide (InGaP) that is made in more than one epitaxial growth sequence without damaging loss of phosphorus from previously grown layers during the growth of subsequent layers.

BACKGROUND OF THE INVENTION

Figure 9:
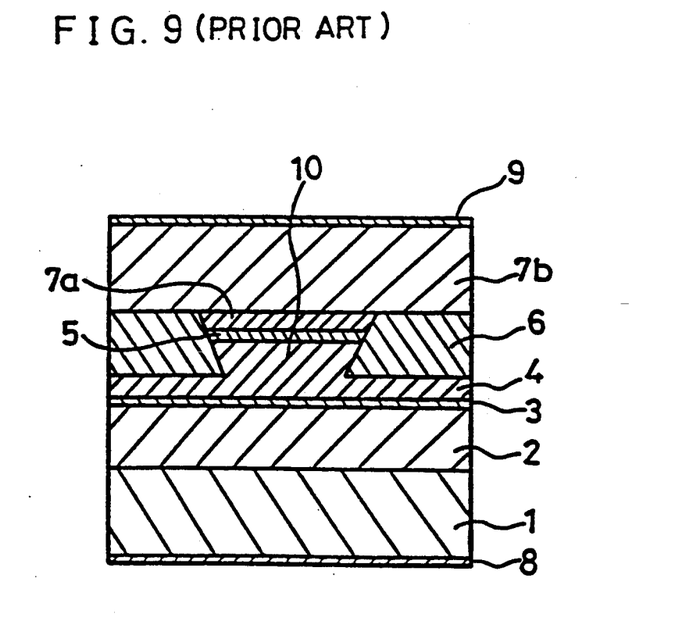
FIG. 9 is a cross-sectional view of a prior art semiconductor laser producing visible light.

A cross-sectional view of a prior art semiconductor laser producing light visible to the naked eye is shown in FIG. 9. The laser includes an n-type gallium arsenide (GaAs) substrate 1, an n-type $(Al_{0.7}Ga_{0.3})_{0.5}In_{0.5}P$ cladding layer 2 disposed on the GaAs substrate 1, and an undoped $Ga_{0.5}In_{0.5}P$ active layer 3 disposed on the cladding layer 2. A p-type $(Al_{0.7}Ga_{0.3})_{0.5}In_{0.5}P$ cladding layer 4 is disposed on the active layer 3 and also includes a centrally disposed mesa or ridge portion. A p-type $Ga_{0.5}In_{0.5}P$ transition layer 5 is disposed on the mesa portion of the cladding layer 4. A p-type GaAs contacting layer portion 7a is disposed on the transition layer 5 in the mesa portion. Together, the contacting layer portion 7a, the transition layer 5, and the mesa portion of the cladding layer 4 comprise a mesa 10. At both sides of the mesa 10 and on the parts of the cladding layer 4 beyond the mesa 10, an n-type GaAs current blocking layer 6 is disposed. The current blocking layer 6, of opposite conductivity type from the cladding layer 4, concentrates the current flow through the semiconductor laser at the mesa 10. A current concentration and collection structure that concentrates current flow in the central portion of the active layer 3 comprises layers 4, 5, and 7a, and the current blocking layer 6. A p-type GaAs contacting layer portion 7b is disposed on the mesa as well as on the current blocking layer 6. Electrodes 8 and 9 are disposed on the substrate 1 and the contacting layer portion 7b, respectively. The transition layer 5 reduces the abruptness of the energy gap transition between the cladding layer 4 and the contacting layer portion 7a and reduces the voltage drop that could occur at a junction directly between the cladding layer 4 and the contacting layer portion 7a.

Typically, the thicknesses of the respective layers in the structure of FIG. 9 are as follows:

TABLE 1

| Layer | Thickness |
| --- | --- |
| cladding layer 2 | 1 micron |
| active layer 3 | 0.08 micron |
| cladding layer 4 (outside mesa 10) | 0.3 micron |
| cladding layer 4 (within mesa 10) | 1 micron |
| transition layer 5 | 0.1 micron |
| current blocking layer 6 | 1.1 microns |
| contacting layer portion 7a | 0.3 micron |
| contacting layer portion 7b | 3 microns. |

The transverse width of mesa 10 at its intersection with the wider part of the cladding layer 4 is about 4 microns.

In accordance with well known semiconductor laser physics, when a current flows between electrodes 8 and 9, charge carriers recombine within the active layer 3 and produce light. When the current density exceeds a certain threshold, the light produced is coherent, i.e., in phase, and laser oscillation occurs. In order to produce laser oscillation, the transverse oscillating mode, i.e., the mode along the active layer 3 dimension in the plane of FIG. 9, must be stabilized. Transverse mode stabilization is achieved in the structure of FIG. 9 by a combination of the thickness of the cladding layer 4 outside the mesa 10 and the presence of the GaAs blocking layer 6. Light produced in the active layer 3 penetrates about one-half micron into the cladding layers 2 and 4. Since the cladding layer 4 is only about 0.3 micron thick outside the mesa 10, some of the light produced in the active layer 3 penetrates into the current blocking layer 6. Since the GaAs current blocking layer has a smaller energy band gap than the active layer 3, the light is absorbed in the current blocking layer 6. On the other hand, at the mesa 10, the cladding layer 4 has a thickness of about 1 micron so that the light is not absorbed in the mesa 10, thereby stabilizing transverse mode oscillations. Effectively, the refractive index of the structure is different within and outside the mesa 10, confining light in the transverse direction in a so-called loss guide structure.

Figure 10A:
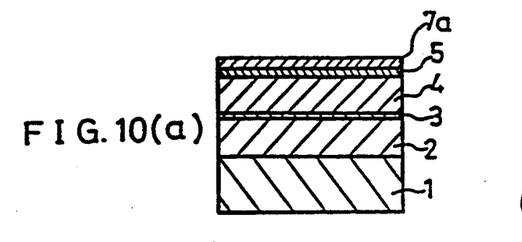
FIG. 10(a)-10(f) illustrate a method of making embodiments of semiconductor lasers according to the prior art and according to the invention.

A method of making the laser structure of FIG. 9 is shown in FIGS. 10(a)–10(f). Initially, as shown in FIG. 10(a), the cladding layer 2, the active layer 3, the cladding layer 4, the transition layer 5, and the contacting layer portion 7a are successively grown on the substrate 1 in a first epitaxial growth sequence. Preferably, the layers are sequentially grown by metal organic chemical vapor deposition (MOCVD) at temperatures of about 650° C. to 700° C. Before the cladding layer 2 is deposited, the temperature of the GaAs substrate 1 is raised to the growth temperature. In order to avoid thermal decomposition of the substrate, an excess pressure of arsenic is provided by flowing arsine ($AsH_3$) over the substrate. When the growth temperature is reached, for deposition of the $(Al_{0.7}Ga_{0.3})_{0.5}In_{0.5}P$ cladding layer 2 is begun by terminating the flow of $AsH_3$ and introducing the source gases for growing the cladding layer 2. Typically, those gases are phosphine ($PH_3$), trimethylaluminum, trimethylgallium, and trimethylindium.

Figure 10B:
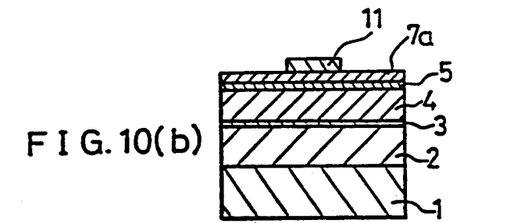
Figure 10C:
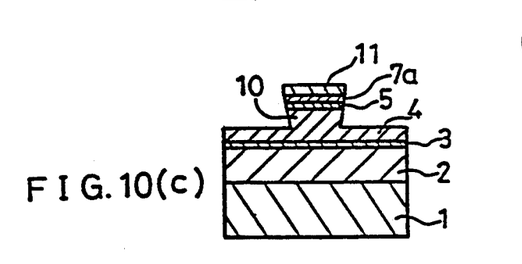

After the epitaxial growth of the layers 2–7a, a silicon nitride (SiN) film is deposited on the contacting layer portion 7a and formed into a mask 11, as shown in FIG. 10(b). The contacting layer portion 7a, the transition layer 5, and the cladding layer 4 beyond of the mask 11 are etched to form the mesa 10. In the structure shown, the mesa 10 is a reverse mesa, i.e., the side walls converge in the direction of the active layer 3. As well known in the art, the provision of a reverse mesa, or a forward mesa in which the walls diverge in the direction of the active layer, can be chosen based upon the orientation of the mask 11 with respect to the crystalline orientation of the substrate 1. The mesa 10 produced by the etching step is shown in FIG. 10(c).

Figure 10D:
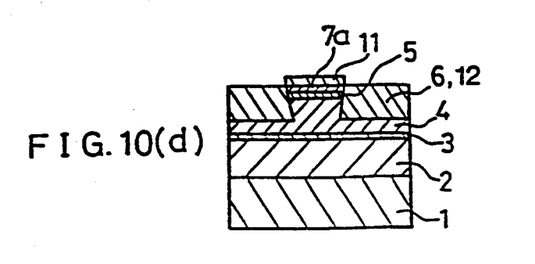

The GaAs current blocking layer 6 is grown, preferably by MOCVD, with the mask 11 in place as shown in FIG. 10(d) Since MOCVD crystal growth is selective, little GaAs deposits on the mask 11. The growth of the current blocking layer 6 comprises a second epitaxial growth sequence in which the temperature of the substrate 1 and the other previously grown layers must be raised from room temperature to the growth temperature and reduced again to room temperature after the deposition of the blocking layer 6. As the temperature is increased, before the current blocking layer 6 is grown, PH$_3$ is passed over the structure and provides an excess pressure of phosphorus to avoid decomposition of, i.e., phosphorus loss from, the exposed $(Al_{0.7}Ga_{0.3})_{0.5}In_{0.5}P$ cladding layer 4. When the growth temperature is reached, the phosphorus supply is terminated and the source gases for growing the n-type GaAs current blocking layer 6, namely, trimethylgallium and AsH$_3$, along with a dopant source gas such as silane (SiH$_4$) or hydrogen selenide (H$_2$Se), are introduced and flow over the structure. After the current blocking layer 6 is grown, the substrate is again cooled so that the SiN mask 11 can be removed.

Figures 10E, 10F:
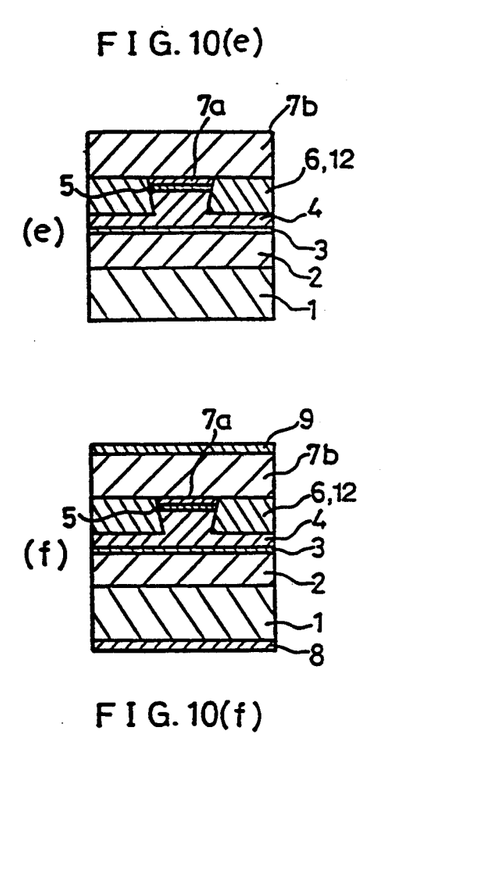

In a third and final epitaxial growth sequence, illustrated in FIG. 10(e), the GaAs contacting layer portion 7b is epitaxially grown on the GaAs contacting layer portion 7b and the current blocking layer 6. The electrodes 8 and 9, shown in FIG. 10(f), are deposited by conventional metal evaporation steps.

Although steps are taken as described above to avoid arsenic loss from the GaAs substrate 1 before the growth of the cladding layer 2 and to prevent phosphorus loss from the cladding layer 4 at the beginning of the second epitaxial growth sequence, it is impossible to prevent arsenic and phosphorus loss since the gaseous sources of those elements must be terminated at the growth temperatures before the source gases for the growth of additional layers are supplied. During the period at the beginning of the second epitaxial growth sequence when no phosphorus containing gas is supplied, phosphorus is lost from the cladding layer 4, producing vacancies and crystalline defects in the cladding layer 4. Since the cladding layer 4 is only about 0.3 micron thick beyond the mesa 10 and adjacent the active layer 3, phosphorus loss defects can even propagate through the cladding layer 4 to the active layer 3. The resulting vacancies act as recombination centers for charge carriers, reducing the light output of the laser and shortening its lifetime. The present invention is directed to preventing the defects, thereby increasing the light output of the laser and extending its lifetime.

One possible solution to the phosphorus loss problem is to continue the flow of PH$_3$ during the growth of the GaAs current blocking layer 6. However, instead of growing a GaAs current blocking layer, in that event a GaAs$_{1-x}$P$_x$ current blocking layer is grown. It is difficult or impossible to produce a single crystal current blocking layer under these conditions because the lattice constant GaAs$_{1-x}$P$_x$ does not match the lattice constant of the cladding layer 4.

Alternatively, the current blocking layer could be $(Al_{0.7}Ga_{0.3})_{0.5}In_{0.5}P$ ($0 < X \leq 1$) instead of GaAs. If that material is employed, the phosphorus pressure can be maintained during growth of the current blocking layer 6, protecting the cladding layer 4. However, the energy band gap of $(Al_{0.7}Ga_{0.3})_{0.5}In_{0.5}P$ may be larger than the energy band gap of the $Ga_{0.5}In_{0.5}P$ active layer 3. In that event, the light produced in the active layer 3 is not absorbed in the current blocking layer 6 outside the mesa 10 so that no transverse oscillation mode stability can be achieved.

Transverse light confinement can be achieved by other structures besides the loss guide structure of FIG. 9. For example, when the current blocking layer 6 is $(Al_xGa_{1-x})_{0.5}In_{0.5}P$, the aluminum composition of the cladding layer can be increased, for example, to $x > 0.7$, so that an actual rather than an effective transverse refractive index distribution confines light generated in the active layer 3 to the mesa 10. However, when the aluminum content of the current blocking layer becomes too high, it is difficult to grow $(Al_xGa_{1-x})_{0.5}In_{0.5}P$ epitaxially on the cladding layer 4.

SUMMARY OF THE INVENTION

The present invention is directed to solving the problems described. The general object of the invention is to provide a semiconductor laser producing visible light with an extended lifetime by preventing the creation of crystalline defects in semiconductor layers of the laser, such as the cladding layers and active layer, during epitaxial growth steps.

In particular, it is an object of the invention to provide a semiconductor laser producing visible light in which the loss of phosphorus from a cladding layer during growth of a current blocking layer is prevented while still providing for stable transverse mode oscillation with a loss guide structure.

According to one aspect of the present invention, a semiconductor laser producing visible light comprises a first conductivity type GaAs substrate, a first conductivity type $(Al_wGa_{1-w})_{0.5}In_{0.5}P$ cladding layer disposed on the substrate, a $(Al_zGa_{1-z})_{0.5}In_{0.5}P$ active layer disposed on the first conductivity type cladding layer wherein $0 \leq z < w$, a second conductivity type $(Al_w Ga_{1-w})_{0.5}In_{0.5}P$ cladding layer having a lattice constant and disposed on the active layer, a first conductivity type $In_{1-x}Ga_xAs_{1-y}P_y$ current blocking layer disposed on part of the second conductivity type cladding layer wherein y is approximately equal to $-2x+2$, $0.5 \leq x < 1$, and $0 < y \leq 1$ so that the lattice constant of the current blocking layer is substantially the same as the lattice constant of the second conductivity type cladding layer, a current concentration and collection structure in contact with the second conductivity type cladding layer for concentrating current flow in a central part of the active layer, and first and second electrodes disposed in contact with the substrate and current concentration and collection structure, respectively.

According to another aspect of the invention, a semiconductor laser producing visible light comprises a first conductivity type GaAs substrate; a first conductivity type $(Al_wGa_{1-w})_{0.5}In_{0.5}P$ cladding layer disposed on the substrate; a $(Al_zGa_{1-z})_{0.5}In_{0.5}P$ active layer disposed on the first conductivity type cladding layer wherein $0 \leq z < w$; a second conductivity type $(Al_w Ga_{1-w})_{0.5}In_{0.5}P$ cladding layer disposed on the active layer; a current concentration and collection structure in contact with the second conductivity type cladding layer for concentrating current flow in a central part of the active layer including a first conductivity type $(Al_xGa_{1-x})_{0.5}In_{0.5}P$ current blocking buffer layer disposed on part of the second conductivity type cladding layer wherein $x \leq w$, a first conductivity type GaAs current blocking layer disposed on the second conductivity type cladding layer, and second conductivity type layers in contact with the second conductivity type cladding layer and the current blocking layer; and first and second electrodes disposed in contact with the substrate and current collection means, respectively.

Other objects and advantages of the present invention will become apparent from the detailed description that follows. The detailed description and specific embodiments are provided for illustration only, since various changes and additions within the spirit and scope of the invention will become apparent to those of skill in the art from the detailed description.

DETAILED DESCRIPTION OF PREFERRED EMBODIMENTS

Figure 1:
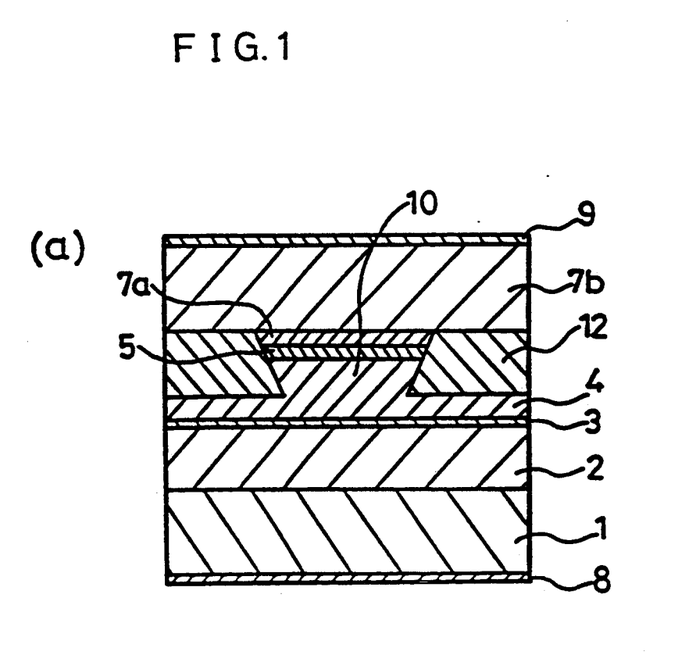
FIGS. 1(a) and 1(b) are cross-sectional and perspective views, respectively, of a semiconductor laser producing visible light in accordance with an embodiment of the invention.

FIGS. 1(a) and 1(b) are a cross-sectional and perspective view, respectively, of a semiconductor laser producing visible light in accordance with the present invention. This embodiment of the invention is identical to the prior art structure described with respect to FIG. 9 with the exception that the GaAs blocking layer 6 of the prior art structure of FIG. 9 is replaced in the embodiment of FIGS. 1(a) and 1(b) by an n-type $In_{1-x}Ga_xAs_{1-y}P_y$ current blocking layer 12. The composition of the current blocking layer 12, i.e., the values of x and y, are chosen so that that layer has a smaller energy band gap than the energy band gap of the $Ga_{0.5}In_{0.5}P$ active layer 3 and so that the lattice constant of the current blocking layer 12 matches the lattice constants of GaAs and the $(Al_{0.7}Ga_{0.3})_{0.5}In_{0.5}P$ cladding layer 4.

Figure 2:
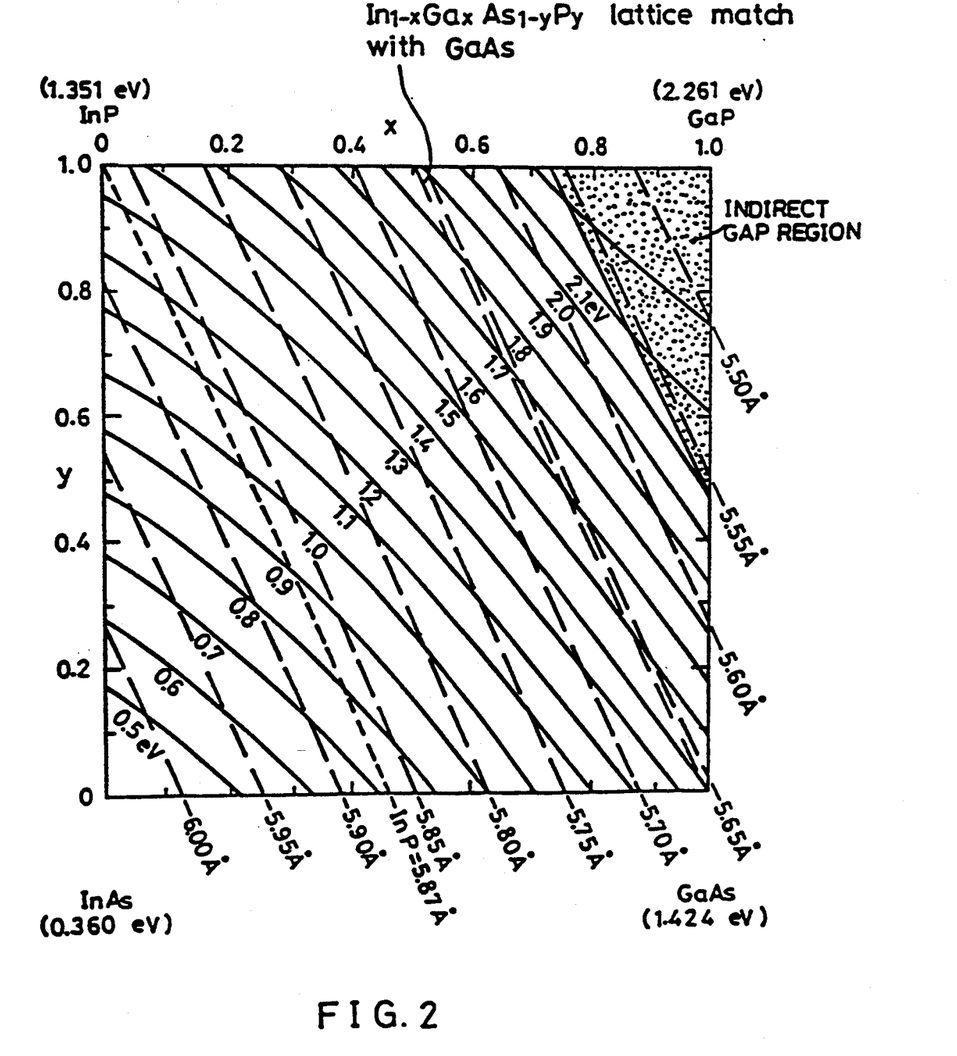
FIG. 2 is a graph of the lattice constant and energy band gap of $In_{1-x}Ga_xAs_{1-y}P_y$ as a function of x and y.

The values of x and y to achieve the desired energy band gap relationship and the lattice constant match can be selected from FIG. 2 which is a graph showing, along oblique broken lines, the lattice constant of $In_{1-x}Ga_xAs_{1-y}P_y$ as a function of x and y. The values of x and y are plotted on the abscissa and ordinate, respectively. The curved lines of FIG. 2 represent the energy band gap of the material as a function of x and y. For given values of x and y, both the energy band gap and lattice constant can be found from FIG. 2. As indicated on FIG. 2, one of the oblique lines represents a lattice match between $In_{1-x}Ga_xAs_{1-y}P_y$ and GaAs which has the same lattice constant as $(Al_{0.7}Ga_{0.3})_{0.5}In_{0.5}P$. The relationship of x and y along that line is $y = -2x + 2$ where $0.5 \leq x \leq 1$ and $0 \leq y \leq 1$. Since, in the structure of FIG. 1(a), the current blocking layer 12 cannot be GaAs, the ranges of interest are $0.5 \leq x < 1$ and $0 < y \leq 1$. In order to understand the benefit achieved by employing $In_{1-x}Ga_xAs_{1-y}P_y$ with the lattice constant matched to GaAs as the current blocking layer 12, the production process of the laser structure must be considered. At the end of that production process described with respect to FIGS. 10(a)-10(f), the structure is cleaved to produce the opposed facets 16 and 17 transverse to the cladding layers 2 and 4 and to the active layer 3, as shown in FIG. 1(b). The facets 16 and 17 form an optical resonator with the cladding layers 2 and 4 and the active layer 3 to support laser oscillation.

Although the material employed for the current blocking layer 12 in the invention is different from the material of the current blocking 6 of FIG. 9, steps in the production of the novel structure are illustrated by FIGS. 10(a)-10(f). In all figures, the same elements are given the same reference numbers. In FIGS. 10(d)-10(f), the current blocking layer is given the number 6 with reference to the description of the prior art laser structure of FIG. 9 and the number 12 with reference to the novel laser structure of FIG. 1(a). The steps corresponding to FIGS. 10(a)-10(c) are identical for both the prior art and novel structure and, therefore, do not have to described a second time.

In FIG. 10(d), an n-type $In_{1-x}Ga_xAs_{1-y}P_y$ current blocking layer 12 is grown by MOCVD. Typically, the growth temperature is about 600° C., 50° to 100° C. lower than the temperature employed to deposit the GaAs current blocking layer 6 of the prior art structure. As the structure of FIG. 10(c) is heated to the growth temperature of the current blocking layer 12, diluted $PH_3$ flows over the structure to provide an excess phosphorus pressure and prevent the creation of phosphorus vacancies in the cladding layer 4. When the growth temperature is reached, the other source gases for depositing the current blocking layer 12, namely, trimethylindium, trimethylgallium, and $AsH_3$, along with a dopant source gas, such as $H_2Se$ or $SiH_4$, is added to the already flowing $PH_3$. Since there is no time period in which the excess phosphorus pressure is absent, advantageously there is no loss of phosphorus from the cladding layer 4 and no creation of vacancies or crystalline defects that can reach the active layer 3 only 0.3 micron away. Another important advantage is achieved in the invention because the growth temperature of the current blocking layer 12 is at least 50° lower than the growth temperature of the GaAs current blocking layer, further significantly reducing the likelihood of phosphorus loss. In addition, because the lattice constant of the current blocking layer 12 matches the lattice constant of the cladding layer 4, there is no difficulty in growing a current blocking layer of good crystalline quality.

The structure is completed in the steps illustrated in FIGS. 10(e) and 10(f) in the same manner already described with respect to the prior art laser. Therefore, repeated explanation of those figures is not required. The cleaving step producing the facets 16 and 17 is carried out before or after the electrodes 8 and 9 are formed.

The laser light generation mechanism in the novel laser of FIG. 1(a) is the same as that of the prior art structure of FIG. 9. The energy band gap of the $In_{1-x}Ga_xAs_{1-y}P_y$ current blocking layer 12 is smaller than that of the $Ga_{0.5}In_{0.5}P$ active layer. Therefore, the current blocking 12 absorbs light generated in the active layer outside the mesa 10 that passes through the relatively thin portion of the cladding layer 4. In other words, the same loss guide structure is provided, producing the same transverse effective refractive index distribution desired.

Figure 3:
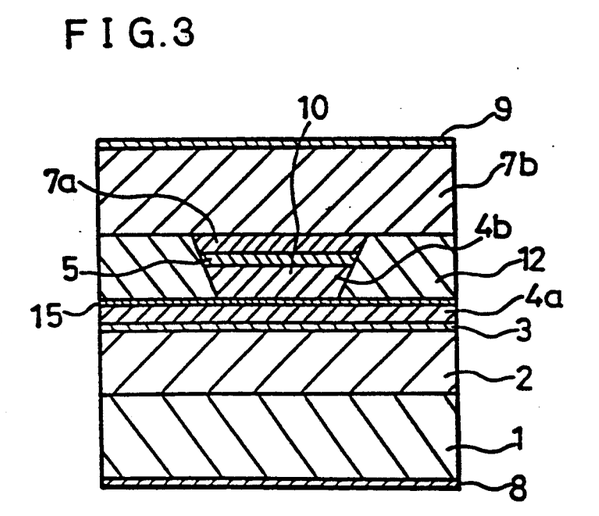
FIG. 3 is a cross-sectional view of a semiconductor laser in accordance with an embodiment of the invention.

Another embodiment of a semiconductor laser according to the invention is shown in a cross-sectional view in FIG. 3. In that structure, the cladding layer is divided into two portions, portion 4a disposed on the active layer 3 and portion 4b within the mesa 10. Those two portions of the cladding layer are separated by an etch stopping layer 15 which is also interposed between the current blocking layer 12 and the first portion 4a of the cladding layer. In the embodiment of the invention described with the particular conductivity types specified, the etch stopping layer is a p-type semiconductor layer of either the same composition as the active layer 3, namely, $Ga_{0.5}In_{0.5}P$, or has the same constituents, but a lower proportion of aluminum, as the portions 4a and 4b of the cladding layer. The reduced quantity of aluminum in the etch stopping layer is necessary to produce different etching rates for the portion 4b of the cladding layer and the etch stopping layer 15.

The etch stopping layer 15 is useful in forming the mesa 10. After the silicon nitride mask 11 shown in FIG. 10(c) is formed, a series of etchants may be employed to etch the respective contacting layer portion 7a, transition layer 5, and portion 4b of the cladding layer. For example, those three layers may be respectively etched by equal volumes of tartaric acid and hydrogen peroxide, hydrochloric acid and phosphoric acid, and sulfuric acid and water to form the mesa 10. The etching rate of the etch stopping layer 15 is substantially lower than the etching rate of the portion 4b of the cladding layer, so that the mesa 10 can be accurately formed without damaging to the portion 4a of the cladding layer.

Figure 4:
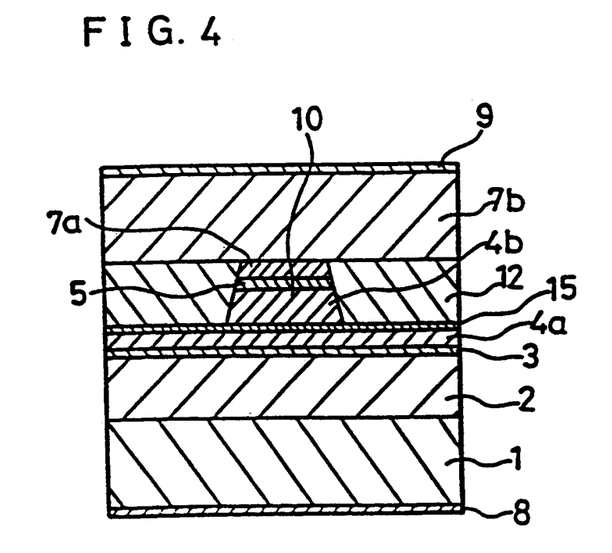
FIG. 4 is a cross-sectional view of a semiconductor laser in accordance with an embodiment of the invention.

Yet another embodiment of the invention is shown in FIG. 4 in cross-section. In the structure of FIG. 4, the mesa 10 is a forward mesa, i.e., its side walls diverge in the direction of the active layer 3. In the structures of FIGS. 1(a) and 3, the mesa 10 is a reverse mesa structure in which those side walls converge in the direction of the active layer 3. As well known in the art, the type of mesa structure may be chosen based upon the orientation of the mask 11 relative to the crystalline orientation of the substrate 1. Otherwise, the structure of FIG. 4 is identical to that of FIG. 3 and does not require additional explanation.

The structures of FIGS. 3 and 4 are produced in the same fashion described for the embodiment of FIG. 1(a) except that, in the first epitaxial growth sequence, the growth of the cladding layer 4 is interrupted temporarily while the etching stopping layer 15 is grown. Typically, that etch stopping layer 15 is no more than about 4 to 20 nanometers (nm) thick. When the etch stopping layer 15 is AlGaInP, it has some susceptibility to thermal decomposition, a susceptibility that increases as the aluminum content decreases. However, since, in this embodiment of the invention, the current blocking layer 12 is grown at a reduced temperature of approximately 600° C., surface defects and roughness that can occur with an AlGaInP layer at higher growth temperatures are avoided.

Figure 5:
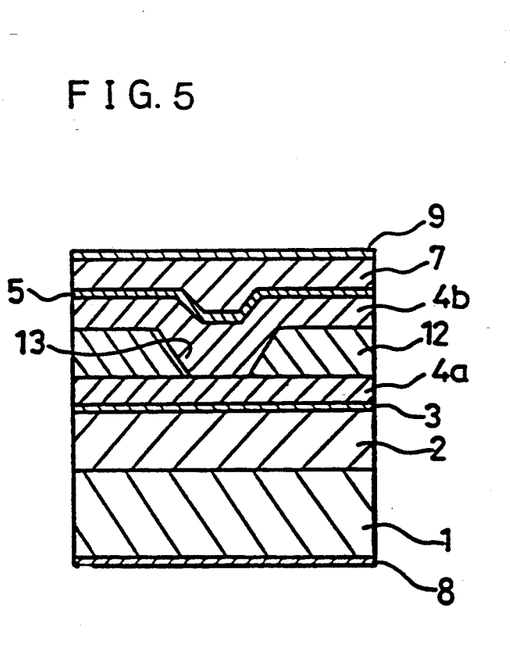
FIG. 5 is a cross-sectional view of a semiconductor laser in accordance with an embodiment of the invention.

Yet another embodiment of the invention is shown in a cross-sectional view in FIG. 5. While the embodiments of the invention heretofore described have employed a mesa structure, the embodiment of FIG. 5 is a groove-type laser in which two cladding layer portions 4a and 4b are partially separated by the current blocking layer 12. The current blocking layer 12 is opposite in conductivity type from the cladding layer portions 4a and 4b so that the current flowing between the electrodes 8 and 9 is concentrated in the central portion of the active layer 3 where a groove 13 passes through the current blocking layer 12 and where the cladding layer portions 4a and 4b unite. The current blocking layer 12 provides transverse mode stabilization by absorbing light produced in the active layer 3 outside the groove 13 that passes through the current blocking layer 12. That groove 13 is typically about 4 microns wide just as the mesa 10 of the other embodiments is about 4 microns wide where the mesa joins the cladding layer 4 (FIG. 1(a)) and where the cladding layer portion 4b is directly opposite the cladding layer portion 4a (FIGS. 3 and 4).

A method of producing the groove-type laser structure of FIG. 5 is shown in FIGS. 6(a)–6(e). The processes involved are only slightly different from those previously described with respect to FIGS. 10(a)–10(f) and do not require a detailed description.

Figure 6A:
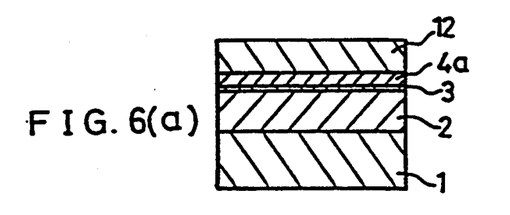
FIGS. 6(a)-6(e) illustrate a process of making the semiconductor laser of FIG. 5.
Figure 6B:
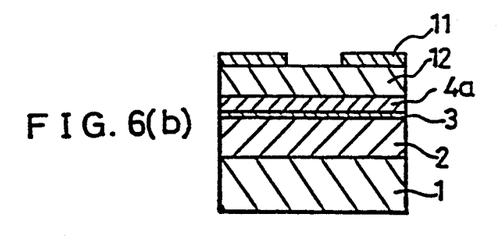

In the first epitaxial growth sequence illustrated in FIG. 6(a), the cladding layer 2, the active layer 3, the cladding layer portion 4a, and the currently blocking layer 12 are successively, sequentially grown by MOCVD. An SiN mask 11 is formed on the current blocking layer 12. This mask 11, as shown in FIG. 6(b), has a central opening, just the opposite of the single, central stripe mask 11 of FIG. 10(b).

Figure 6C:
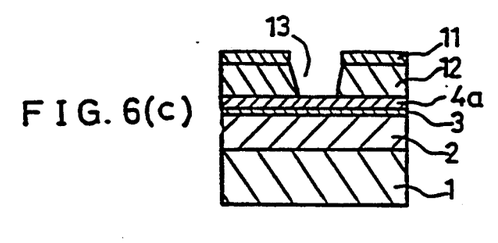
Figure 6D:
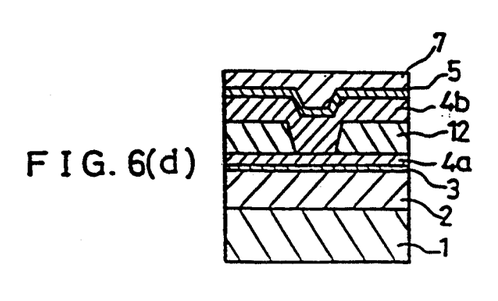

As illustrated in FIG. 6(c), the groove 13 is formed by etching the current blocking layer 12 through the opening in the mask 11 to expose the cladding layer portion 4a. After removal of the mask 11, as illustrated in FIG. 6(d), in the second epitaxial growth step the cladding layer portion 4b, the transition layer 5, and the contacting layer 7 are successively grown.

Figure 6E:
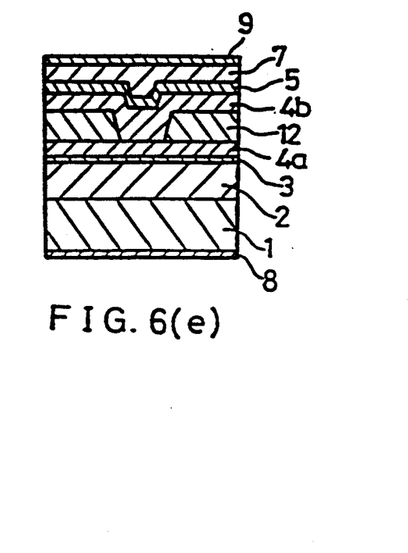

Finally, as illustrated in FIG. 6(e), electrodes 8 and 9 are formed on opposite surfaces, i.e., on the substrate 1 and the contacting layer 7. In this embodiment of the invention, only two epitaxial growth sequences are required rather than the three sequences required with the mesa structures previously described.

The foregoing embodiments of the invention have been described with respect to an active layer of $Ga_{0.5}In_{0.5}P$. However, the active layer may also contain some proportion of aluminum, i.e., may be $(Al_xGa_{1-x})_{0.5}In_{0.5}P$. The proportion of aluminum in the $(Al_{0.7}Ga_{0.3})_{0.5}In_{0.5}P$ cladding layers 2 and 4 on opposite sides of the active layer is not limited to 0.35 as described for the specific embodiments. Generally, the cladding layer may be $(Al_wGa_{1-w})_{0.5}In_{0.5}P$ where $z<w$. Aluminum is added to the active layer in order to shorten the wavelength of oscillation of the laser. In order to maintain confinement of the light produced in the active layer, the aluminum content o the cladding layer is kept at a higher proportion than the aluminum content of the active layer. The current blocking layer has been described as a single layer of $In_{1-x}Ga_xAs_{1-y}P_y$, but may include multiple layers of that material which the values or x and/or y are different.

Figure 7:
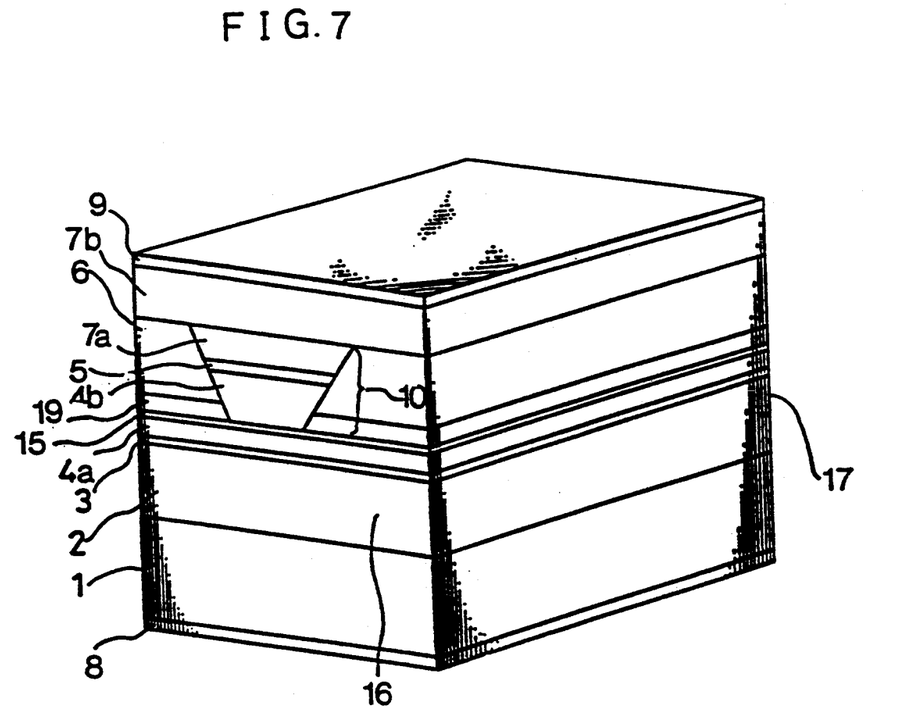
FIG. 7 is a cross-sectional view of a semiconductor laser in accordance with an embodiment of the invention.

Still another embodiment of the invention is shown in a perspective view in FIG. 7. The embodiment of the invention shown in FIG. 7 is the same as the prior art structure of FIG. 9 with the following exceptions. The cladding layer 4 is divided into two portions 4a and 4b, like the embodiment of FIG. 3, by an etch stopping layer 15 of GaInP. An n-type $(Al_xGa_{1-x})_{0.5}In_{0.5}P$ current blocking buffer layer 19 is disposed on the etch stopping layer 15 at the sides of the mesa 10. The n-type GaAs current blocking laser 6 is disposed on the current blocking buffer layer 19 at the sides of the mesa 10 and in contact with the contacting layer portions 7a and 7b. The structure of FIG. 7 is prepared in the same manner, by successive MOCVD epitaxial growth sequences, as described for other embodiments of the invention. After the formation of the mesa 10 by etching, before the beginning of the growth of the n-type GaAs current blocking layer 6, the n-type $(Al_xGa_{1-x})_{0.5}In_{0.5}P$ current blocking buffer layer 19 is grown. That buffer layer can be grown at a temperature about 50° C. lower than the growth temperature of the GaAs current blocking layer and can be grown without interrupting the source of excess phosphorus so that the etch stopping layer 15 and cladding layer portion 4a do not lose phosphorus either while the temperature of the structure is raised for growing the blocking buffer layer or during growth of the blocking buffer layer. Thus, crystalline defects and surface roughness in the etch stopping layer 15, the cladding layer portion 4a, and the active layer 3 resulting from phosphorus loss is avoided. In addition, another important advantage is achieved by this embodiment of the invention.

In the loss guide structure employed in the novel lasers, light is absorbed in the current blocking layer to provide transverse mode stability. An important factor in the effectiveness of that loss guide structure is the lifetime of charge carriers in the current blocking layer. Preferably, the carrier lifetime is as short as possible so that carriers are not stored for too long and are, thereby, not encouraged to flow into other layers. Extended carrier lifetimes result in the storage of carriers in the current blocking layer which can reduce potential barriers and cause undesired current flows. Carrier lifetime depends, to a degree, on the charge carrier concentration, i.e., the doping level, of the current blocking layer 6. The higher the dopant impurity concentration, the shorter the carrier lifetime will be. With GaAs, good current blocking is achieved when the dopant impurity concentration exceeds $2 \times 10^{18}$ cm$^{-3}$. However, it is far more difficult to dope $(Al_xGa_{1-x})_{0.5}In_{0.5}P$ than GaAs. Thus, poor results would be obtained if only $(Al_xGa_{1-x})_{0.5}In_{0.5}P$ were employed as the current blocking layer.

In the embodiment of the invention shown in FIG. 7, by employing a $(Al_xGa_{1-x})_{0.5}In_{0.5}P$ blocking buffer layer 19, the problem of phosphorus loss during fabrication of the laser structure is avoided. By employing GaAs as the current blocking layer 6, sufficiently high doping and short charge carrier lifetimes are achieved for effective current blocking. Preferably, the current blocking buffer layer 19 does not exceed about 40 nm in thickness which is a sufficient thickness for effective current blocking and protection against phosphorus loss during growth of the current blocking layer 6. If the current blocking buffer layer 19 is too thick, it can contribute to undesired current leakage. When the active layer 3 is $(Al_zGa_{1-z})_{0.5}In_{0.5}P$ and the current blocking buffer layer 19 is $(Al_xGa_{1-x})_{0.5}In_{0.5}P$, it is advantageous that $y \leq z$ to ensure light absorption in the current blocking buffer layer 19 as well as in the current blocking layer 6. Most preferably, the current blocking buffer layer 19 has substantially the same lattice constant as the GaAs current blocking layer 6 and the active layer 3 to ensure the crystalline quality of the current blocking layer.

While it is preferred that the current blocking buffer layer 19 be of the same conductivity type as the current blocking layer 6, because it is so thin, the blocking buffer layer may be undoped, of high resistance, or even p-type.

Figure 8:
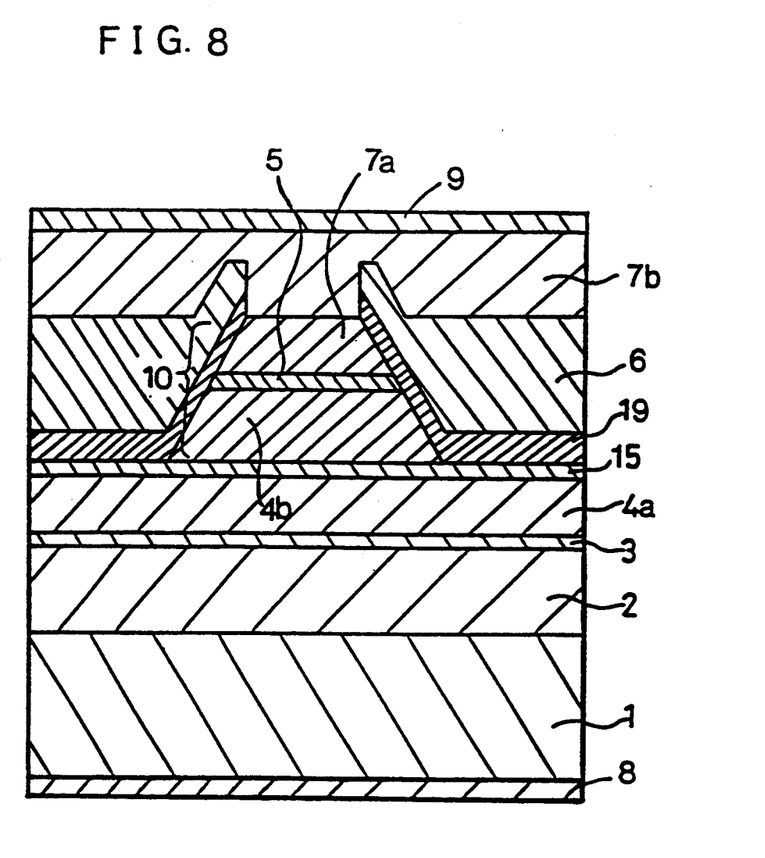
FIG. 8 is a cross-sectional view of a semiconductor laser in accordance with an embodiment of the invention.

A further embodiment of the invention is shown in a cross-sectional view in FIG. 8. In a process producing the semiconductor laser of FIG. 8, the mesa 10 is formed by etching before the blocking buffer layer 19 is grown. That blocking buffer layer 19 and the current blocking layer 6 are successively grown with the mask 11 in place in a second MOCVD sequence. After the mask 11 is removed, providing access to the contacting layer portion 7a, the contacting layer portion 7b is grown in a third MOCVD sequence. Thereafter, the electrodes 8 and 9 are formed and the structure is cleaved to produce the facets of the laser.

In each of the embodiments described, the semiconductor laser includes a current concentration and collection structure for concentrating the current flow between the electrodes 8 and 9 in the central part of the active layer 3. The current concentration and collection structure embodiments include the mesa 10 and its layers as well as the adjacent current blocking layer 12 (FIGS. 1(a), 3, and 4), the groove 13, the cladding layer portion 4b, and the adjacent current blocking layer 12 (FIG. 5), the mesa 10 and its layers, the adjacent current blocking buffer layer 19, and the current blocking layer 6 (FIGS. 7 and 8).

We claim:

1. A semiconductor laser producing visible light comprising:

a first conductivity type GaAs substrate;

a first conductivity type $(Al_wGa_{1-w})_{0.5}In_{0.5}P$ cladding layer disposed on said substrate;

a $(Al_zGa_{1-z})_{0.5}In_{0.5}P$ active layer disposed on said first conductivity type cladding layer wherein $0 \leq z \leq w$;

a second conductivity type $(Al_wGa_{1-w})_{0.5}In_{0.5}P$ cladding layer having a lattice constant and disposed on said active layer;

a first conductivity type $In_{1-x}Ga_xAs_{1-y}P_y$ current blocking layer disposed on part of said second conductivity type cladding layer wherein y is approximately equal to $-2x+2$, $0.5 \leq x < 1$, and $0 < y \leq 1$ so that the lattice constant of said current blocking layer is substantially the same as the lattice constant of said second conductivity type cladding layer;

a current concentration and collection structure in contact with said second conductivity type cladding layer for concentrating current flow in a central part of said active layer;

facets transverse to said cladding layers and said active layer forming an optical resonator therewith for supporting laser oscillation; and first and second electrodes disposed in contact with said substrate and current concentration and collection structure, respectively.

2. The semiconductor laser of claim 1 wherein z=0.

3. The semiconductor laser of claim 1 wherein z is no more than 0.7.

4. The semiconductor laser of claim 1 wherein said current concentration and collection structure comprises a mesa structure including a portion of said second conductivity type cladding layer, a second conductivity type GaInP transition layer disposed on said second conductivity type cladding layer, a second conductivity type GaAs contacting layer portion disposed between said transition layer and said second electrode, and a first conductivity type current blocking layer adjacent said mesa.

5. The semiconductor laser of claim 1 including an etch stopping layer disposed between said second conductivity type cladding layer and said current blocking layer.

6. The semiconductor layer of claim 5 wherein said etch stopping layer is selected from the group consisting of GaInP and AlGaInP.

7. The semiconductor laser of claim 5 wherein said current concentration and collection structure comprises a mesa structure including a portion of said second conductivity type cladding layer, a second conductivity type GaInP transition layer disposed on said second conductivity type cladding layer, a second conductivity type GaAs contacting layer disposed between said transition layer and said second electrode, and a first conductivity type current blocking layer adjacent said mesa.

8. The semiconductor laser of claim 1 wherein said current concentration and collection structure comprises a groove structure including a first portion of said second conductivity type cladding layer, a second conductivity type GaInP transition layer disposed on said first portion of said second conductivity type cladding layer, a second conductivity type GaAs contacting layer disposed between said transition layer and said second electrode, and a first conductivity type current blocking layer disposed on a second portion of said second conductivity type cladding layer and containing a groove through which the first and second portions of said second conductivity type cladding layer are joined to each other.

9. A semiconductor laser producing visible light comprising:
   a first conductivity type GaAs substrate;
   a first conductivity type $(Al_wGa_{1-w})_{0.5}In_{0.5}P$ cladding layer disposed on said substrate;
   a $(Al_zGa_{1-z})_{0.5}In_{0.5}P$ active layer disposed on said first conductivity type cladding layer wherein $0 \leq z < w$;
   a second conductivity type $(Al_wGa_{1-w})_{0.5}In_{0.5}P$ cladding layer disposed on said active layer;
   a current concentration and collection structure in contact with said second conductivity type cladding layer for concentrating current flow in a central part of said active layer including a first conductivity type $(Al_xGa_{1-x})_{0.5}In_{0.5}P$ current blocking buffer layer disposed on part of said second conductivity type cladding layer wherein $x \leq w$, a first conductivity type GaAs current blocking layer disposed on said second conductivity type cladding layer, and second conductivity type layers in contact with said second conductivity type cladding layer and said current blocking layer;
   facets transverse to said cladding layers and said active layer forming an optical resonator therewith for supporting laser oscillation; and
   first and second electrodes disposed in contact with said substrate and current collection means, respectively.

10. The semiconductor laser of claim 9 wherein $z=0$.

11. The semiconductor laser of claim 9 wherein said current concentration and collection structure comprises a mesa structure including ak portion of said second conductivity type cladding layer, a second conductivity type GaInP transition layer disposed on said second conductivity type cladding layer, and a second conductivity type GaAs contacting layer disposed between said transition layer and said second electrode.

12. The semiconductor laser of claim 9 including an etch stopping layer disposed between said second conductivity type cladding layer and said current blocking layer.

13. The semiconductor layer of claim 12 wherein said etch stopping layer is selected from the group consisting of GaInP and AlGaInP.

14. The semiconductor laser of claim 12 wherein said current concentration and collection structure comprises a mesa structure including a portion of said second conductivity type cladding layer, a second conductivity type GaInP transition layer disposed on said second conductivity type cladding layer, and a second conductivity type GaAs contacting layer disposed between said transition layer and said second electrode.

15. The semiconductor laser of claim 9 wherein said current blocking buffer layer and said current blocking layer have respective lattice constants and the respective lattice constants are substantially equal.

* * * * *